United States Patent
Herrmann et al.

(10) Patent No.: US 10,270,001 B2
(45) Date of Patent: Apr. 23, 2019

(54) DEVICE HAVING AT LEAST TWO WAFERS FOR DETECTING ELECTROMAGNETIC RADIATION AND METHOD FOR PRODUCING SAID DEVICE

(71) Applicant: Robert Bosch GmbH, Stuttgart (DE)

(72) Inventors: Ingo Herrmann, Friolzheim (DE); Karl-Franz Reinhart, Weinsberg (DE); Tjalf Pirk, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 449 days.

(21) Appl. No.: 14/428,736

(22) PCT Filed: Aug. 8, 2013

(86) PCT No.: PCT/EP2013/066635
§ 371 (c)(1),
(2) Date: Mar. 17, 2015

(87) PCT Pub. No.: WO2014/044463
PCT Pub. Date: Mar. 27, 2014

(65) Prior Publication Data
US 2015/0243823 A1 Aug. 27, 2015

(30) Foreign Application Priority Data
Sep. 18, 2012 (DE) .................. 10 2012 216 618

(51) Int. Cl.
*H01L 31/09* (2006.01)
*G01J 5/04* (2006.01)
*G01J 5/20* (2006.01)
*H01L 23/26* (2006.01)
*H01L 27/146* (2006.01)
(Continued)

(52) U.S. Cl.
CPC .......... *H01L 31/09* (2013.01); *B81C 1/00238* (2013.01); *G01J 5/00* (2013.01);
(Continued)

(58) Field of Classification Search
CPC .................................................. H01L 2924/00
See application file for complete search history.

(56) References Cited

U.S. PATENT DOCUMENTS

| 4,532,424 A | 7/1985 | Cheung |
| 8,487,257 B2 * | 7/2013 | Giebeler ................ G01J 5/04 |
| | | 250/338.3 |

(Continued)

FOREIGN PATENT DOCUMENTS

| CN | 101213429 A | 7/2008 |
| CN | 101688811 A | 3/2010 |

(Continued)

OTHER PUBLICATIONS

"Evaluation of Non-Evaporable Getters for High Vacuum Hermetic Packages", Document No. JPL D-27440, pp. 1-31 to Ramesham, available online as of Aug. 1, 2009 at: http://nepp.nasa.gov/docuploads/A3BCB0FC-DE14-498C-816DB88A24A7E09D/GettersFinal%20Report-042404.pdf.*

(Continued)

*Primary Examiner* — Kenneth J Malkowski
(74) *Attorney, Agent, or Firm* — Maginot, Moore & Beck LLP

(57) ABSTRACT

An arrangement of at least two wafers for detecting electromagnetic radiation, in particular far infrared radiation, comprises a first wafer and a second wafer. The first wafer includes a microsystem formed as a sensor array. The microsystem is configured to register electromagnetic radiation and provide a corresponding sensor signal. The second wafer includes an integrated circuit formed as an evaluation circuit that is coupled to the sensor array. The integrated circuit is configured to detect the electromagnetic radiation with the aid of the sensor signal provided.

16 Claims, 4 Drawing Sheets

(51) Int. Cl.
*B81C 1/00* (2006.01)
*G01J 5/00* (2006.01)
*H01L 31/18* (2006.01)
*H01L 23/10* (2006.01)
*H01L 23/00* (2006.01)

(52) U.S. Cl.
CPC ................ *G01J 5/045* (2013.01); *G01J 5/20* (2013.01); *H01L 23/26* (2013.01); *H01L 27/1465* (2013.01); *H01L 27/1469* (2013.01); *H01L 27/14634* (2013.01); *H01L 31/18* (2013.01); *B81B 2201/0207* (2013.01); *B81B 2207/012* (2013.01); *B81B 2207/097* (2013.01); *B81C 2203/0792* (2013.01); *H01L 23/10* (2013.01); *H01L 24/05* (2013.01); *H01L 24/27* (2013.01); *H01L 24/29* (2013.01); *H01L 24/32* (2013.01); *H01L 24/94* (2013.01); *H01L 2224/05609* (2013.01); *H01L 2224/05624* (2013.01); *H01L 2224/05644* (2013.01); *H01L 2224/2745* (2013.01); *H01L 2224/29109* (2013.01); *H01L 2224/29124* (2013.01); *H01L 2224/29144* (2013.01); *H01L 2224/32145* (2013.01); *H01L 2224/94* (2013.01); *H01L 2924/10252* (2013.01); *H01L 2924/10253* (2013.01); *H01L 2924/10272* (2013.01); *H01L 2924/10329* (2013.01); *H01L 2924/10335* (2013.01); *H01L 2924/12043* (2013.01); *H01L 2924/14* (2013.01); *H01L 2924/1433* (2013.01); *H01L 2924/1461* (2013.01)

(56) References Cited

U.S. PATENT DOCUMENTS

| | | |
|---|---|---|
| 2008/0121805 A1 | 5/2008 | Tweet et al. |
| 2009/0084958 A1* | 4/2009 | Vogt .......................... G01J 5/20 250/338.4 |
| 2010/0248399 A1 | 9/2010 | Hsieh |
| 2010/0264311 A1 | 10/2010 | Giebeler et al. |
| 2011/0024860 A1* | 2/2011 | Herrnsdorf ............... G01J 5/10 257/433 |
| 2011/0140224 A1* | 6/2011 | Kropelnicki ............. G01J 5/20 257/436 |
| 2011/0155914 A1* | 6/2011 | Ohhira ...................... G01J 5/02 250/338.4 |
| 2011/0287214 A1 | 11/2011 | Reinert et al. |
| 2013/0056864 A1* | 3/2013 | Cho .................... H01L 23/4334 257/713 |

FOREIGN PATENT DOCUMENTS

| | | |
|---|---|---|
| DE | 10 2007 024 902 A1 | 12/2008 |
| DE | 10 2007 024 903 A1 | 12/2008 |
| DE | 10 2008 043 735 A1 | 5/2010 |
| DE | 10 2011 081 641 A1 | 2/2013 |
| EP | 1 071 126 B1 | 1/2001 |
| EP | 2 343 523 A1 | 7/2011 |
| JP | 3-113352 A | 5/1997 |
| JP | 2007-171170 A | 7/2007 |
| JP | 2010-528301 A | 8/2010 |
| JP | 2011-137744 A | 7/2011 |
| TW | 201019402 A1 | 5/2010 |
| WO | 2010/054875 A1 | 5/2010 |
| WO | 2012/015965 A1 | 2/2012 |

OTHER PUBLICATIONS

International Search Report corresponding to PCT Application No. PCT/EP20131066635, dated Nov. 6, 2013 (German and English language document) (5 pages).

* cited by examiner

DEVICE HAVING AT LEAST TWO WAFERS FOR DETECTING ELECTROMAGNETIC RADIATION AND METHOD FOR PRODUCING SAID DEVICE

This application is a 35 U.S.C. § 371 National Stage Application of PCT/2013/066635, filed on Aug. 8, 2013, which claims the benefit of priority to Serial No. DE 10 2012 216 618.1, filed on Sep. 18, 2012 in Germany, the disclosures of which are incorporated herein by references in their entirety.

The disclosure relates to an arrangement of at least two wafers for detecting electromagnetic radiation, and to a method for producing the arrangement.

BACKGROUND

DE 10 2008 043 735 A1 describes a method for producing a bond connection between at least two wafers. The method described therein comprises application of a first bonding material on a first wafer, aluminum or an aluminum alloy being selected as the first bonding material.

The method furthermore describes the application of a second bonding material on a second wafer, gold being selected as the second bonding material. In the method described therein, a bonding process is subsequently carried out, the first and the second bonding materials being bonded to one another and a wafer-to-wafer bond thereby being produced between the first wafer and the second wafer.

Furthermore, EP 1071126 B1 describes the bonding together of two wafers, various bonding materials being described as suitable for the bonding pads of the two wafers, and bonding pads consisting of gold being used. Furthermore, silicon, indium, aluminum, copper, silver and alloys of these elements are described therein as bonding materials.

FIG. 4 shows an exemplary arrangement 1 of two wafers 10, 20. A first wafer 10 is used as a cap wafer of the arrangement. A second wafer comprises an MEMS region 15 and an ASIC region 5. Metal bonding pads 21, 22, 23 are provided for contacting the second wafer. The MEMS region 15 comprises an MEMS structure with a free-standing tongue structure 18, which comprises a strain gauge 16.

SUMMARY

The present disclosure provides an arrangement of at least two wafers for detecting electromagnetic radiation, in particular far infrared radiation, and a method for producing the arrangement.

The concept of the disclosure is to avoid lateral integration of the evaluation circuit and the vertical combination of ASIC and MEMS structures on a wafer, since common processing of the two structures over very many mask planes increases the reject likelihood for the entire wafer.

The core of the disclosure is the separation of ASIC and MEMS structures, and to integrate the ASIC and MEMS structures respectively on one of two wafers, the two wafers being bonded in a subsequent step by means of metal wafer contacts formed on the two wafers.

This advantageously makes it possible to use particular processes, optimized for ASIC and MEMS structures, for each individual wafer. The disclosure furthermore provides cost advantages by virtue of minimized area occupancy on the respective optimized wafer structures. Furthermore, the present disclosure makes it possible to comply with the required short distances between a sensor pixel of the MEMS structure and the evaluation circuit of the ASIC structure.

Advantageous embodiments and refinements may be found in the claims, description, and figures.

According to one embodiment of the disclosure, the evaluation circuit is configured as a circuit array.

According to one embodiment of the disclosure, the sensor array is configured as an array of at least one diode element. This allows simple production of the sensor array. It furthermore allows reliable operation of the sensor array, use advantageously being made of the fact that the voltage at the diode element changes so that the temperature change of the sensor array caused by radiation can be deduced.

According to one embodiment of the disclosure, the circuit array and the sensor array are configured with similar shapes. In this way, the path lengths between a diode element of the sensor array and the evaluation circuit can be minimized.

According to one embodiment of the disclosure, the at least one diode element is coupled to at least one evaluation unit of the evaluation circuit. In this way, disturbing influences acting externally on the arrangement can be reduced.

According to one embodiment of the disclosure, the at least one diode element is formed by a multiplicity of diodes connected in series. In this way, the radiation-induced effect of a change in the voltage drop on the diode element can advantageously be increased.

According to one embodiment of the disclosure, the integrated circuit is configured as an application-specific integrated circuit. This allows efficient implementation of the sensor array.

According to one embodiment of the disclosure, the arrangement furthermore comprises a third wafer, which is formed as a cap wafer for the sensor array. In this way, a reduced pressure required by the sensor array can be maintained during operation.

According to one embodiment of the disclosure, the sensor array is configured as a microbolometer array for registering the electromagnetic radiation, in particular far infrared radiation. In this way, a change in electrical resistance due to the electromagnetic radiation absorbed at the sensor array and leading to a temperature change in the sensor array can advantageously be registered.

According to one embodiment of the disclosure, the integrated circuit has a heat shield. In this way, the integrated circuit of the arrangement can be protected from overheating caused by the electromagnetic radiation, in particular far infrared radiation.

According to one embodiment of the disclosure, the microsystem has a getter device. In this way, a reduced pressure required by the sensor array can advantageously be maintained continuously during operation of the arrangement.

According to one embodiment of the disclosure, the first wafer has a through-contact This allows simple and reliable contacting of the first wafer.

According to one embodiment of the disclosure, the second wafer has a through-contact. This allows simple and reliable contacting of the second wafer.

The described configurations and refinements may be combined with one another in any desired way.

Other possible configurations, refinements and implementations of the disclosure also comprise combinations, not explicitly mentioned, of features of the disclosure which are described above or below in relation to the exemplary embodiments.

BRIEF DESCRIPTION OF THE DRAWINGS

The appended drawings are intended to impart further understanding of the embodiments of the disclosure. They illustrate embodiments and, in combination with the description, serve to explain principles and concepts of the disclosure.

Other embodiments and many of the advantages mentioned are revealed in relation to the drawings. The elements represented in the drawings are not necessarily shown true to scale with respect to one another.

DETAILED DESCRIPTION

Figure 1:
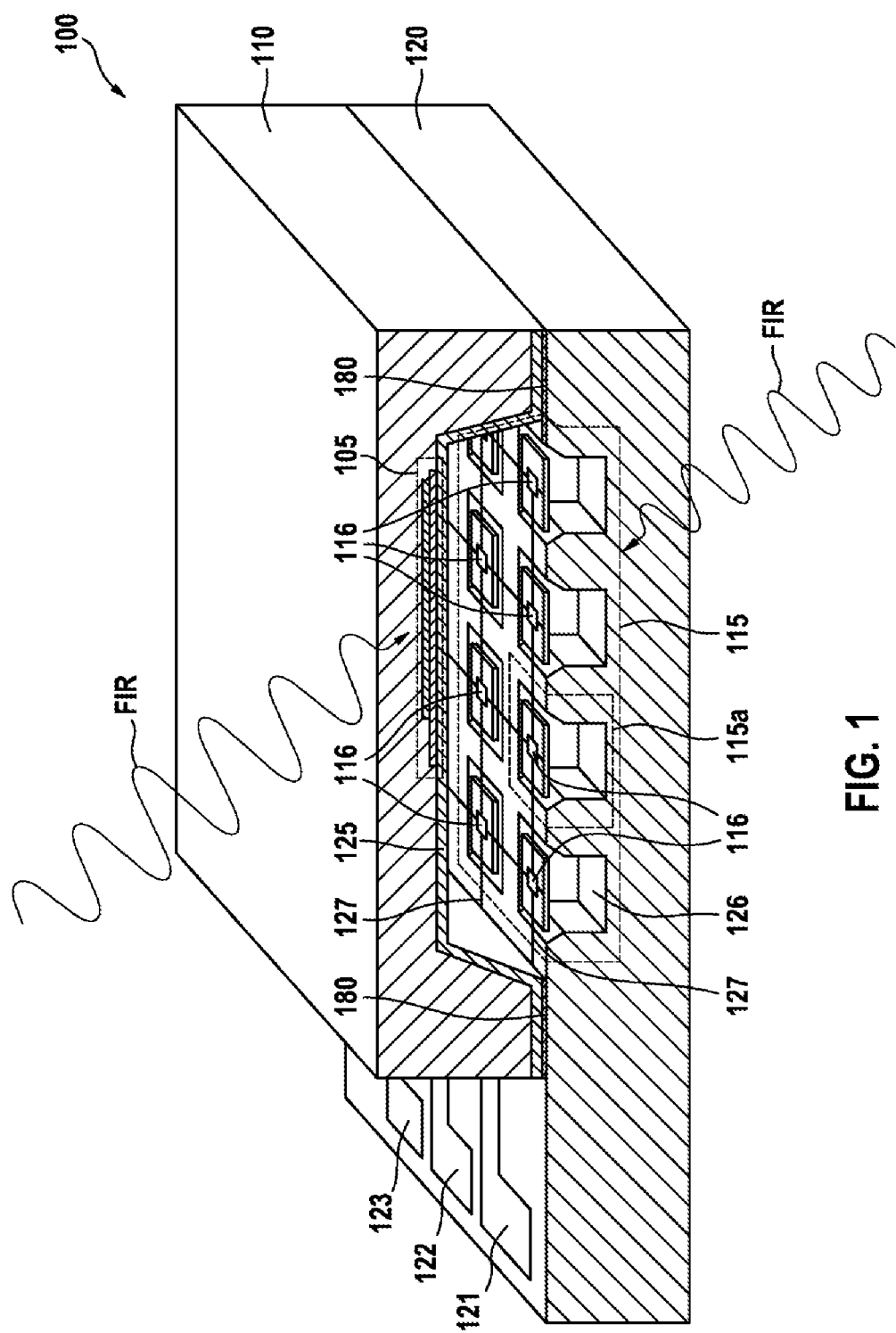
FIG. 1 shows a schematic representation of two wafers for detecting electromagnetic radiation, in particular far infrared radiation, according to one embodiment of the disclosure.

In the figures of the drawing, references which are the same denote elements, constituent parts, components and method steps which are the same or functionally the same, unless otherwise indicated.

FIG. 1 shows a schematic representation of an arrangement of two wafers for detecting electromagnetic radiation, in particular far infrared radiation, according to one embodiment of the disclosure.

In this case, circular or square slices approximately one millimeter thick are referred to as wafers. The wafers may comprise monocrystalline or polycrystalline semiconductor materials, and they are used in general as a substrate for electronic systems. Silicon, germanium, gallium arsenide, silicon carbide or indium phosphide may be used as semiconductor materials.

An arrangement 100 comprises two wafers 120, 110 for detecting electromagnetic radiation, in particular far infrared radiation.

A first wafer 120 comprises a microsystem 115, which is formed as a sensor array and is configured in order to register the electromagnetic radiation, in particular far infrared radiation, and to provide a corresponding sensor signal.

A second wafer 110 comprises an integrated circuit 105, which is formed as an evaluation circuit coupled to the sensor array and is configured in order, with the aid of the sensor signal provided, to detect the electromagnetic radiation, in particular far infrared radiation, by evaluating the sensor signal provided.

For example, the evaluation circuit may be configured in order to determine which sensor element 115a has registered the electromagnetic radiation, in particular far infrared radiation. The sensor array may be configured as an array of sensor elements 115a, each having one or more diode elements 116. The evaluation circuit may furthermore be configured as a circuit array which is configured as an array of evaluation units, one or more diode elements 116 of the sensor array respectively being coupled to an evaluation unit of the evaluation circuit.

An evaluation unit of the evaluation circuit may in this case be configured as a measurement converter, which converts an electrical sensor signal of the diode element 116 configured as a measurement transducer into a normalized electrical signal.

The diode element 116 may be formed from a multiplicity of diodes connected in series, or also from a series circuit of diodes and other electrical components, for instance resistors. Semiconductor diodes which comprise either a p-n-doped semiconductor crystal, silicon, or alternatively germanium, germanium diode, gallium arsenide, or a metal/semiconductor junction, may in this case be used as diodes.

Bonding material 180 may furthermore be vapor-deposited onto the first wafer 120 and onto the second wafer 110; 130, gold or indium or aluminum or another metal suitable for wafer bonding being used as the bonding material.

Bonding pads 121, 122, 123, which are likewise made of gold or indium or aluminum or another metal suitable for contact bonding, are provided for contacting the first wafer 120.

In order to contact the first wafer 120 with the second wafer 110, contacts 125 are provided on the second wafer 110, which connect the integrated circuit 105 to contact pads (not represented) that are formed on the side of the second wafer 110 facing toward the first wafer 120.

Webs of oxide or other nonconductive materials 127 are provided as electrodes for electrically contacting metal—and for fixing the diode elements 116. The diode elements 116 are in this case applied in or on otherwise free-standing material regions. The first wafer 120 comprises, for example, a through-contact 124.

The sensor element 115a furthermore comprises a cavity 126 for thermal insulation of the thermal sensors from the first wafer 120, which is used as a substrate for the sensor elements 115a.

In this case, an individual cavity 126 may be used under each sensor element 115a, or cavities 126 which contain a plurality of sensor elements 115a and form a pixel cluster may be formed.

Likewise, a large cavity may be formed under the entire sensor array.

In the case of a plurality of sensor elements 115a per cavity 126, it is advantageous, in particular for the stability and performance of the sensor elements 115a, to provide support points in order to dissipate the absorbed heat as well as possible into the reservoir of the substrate.

These may for example be configured as walls or also as columns. The production of the cavities may for example be carried out by etching a sacrificial layer, optionally assisted by controlled anchoring of individual cavities by support points, but also by anodic etching of the substrate, porous silicon for example being generated in the substrate. Furthermore, silicon deep etching methods with a similar effect may be carried out.

Figure 2:
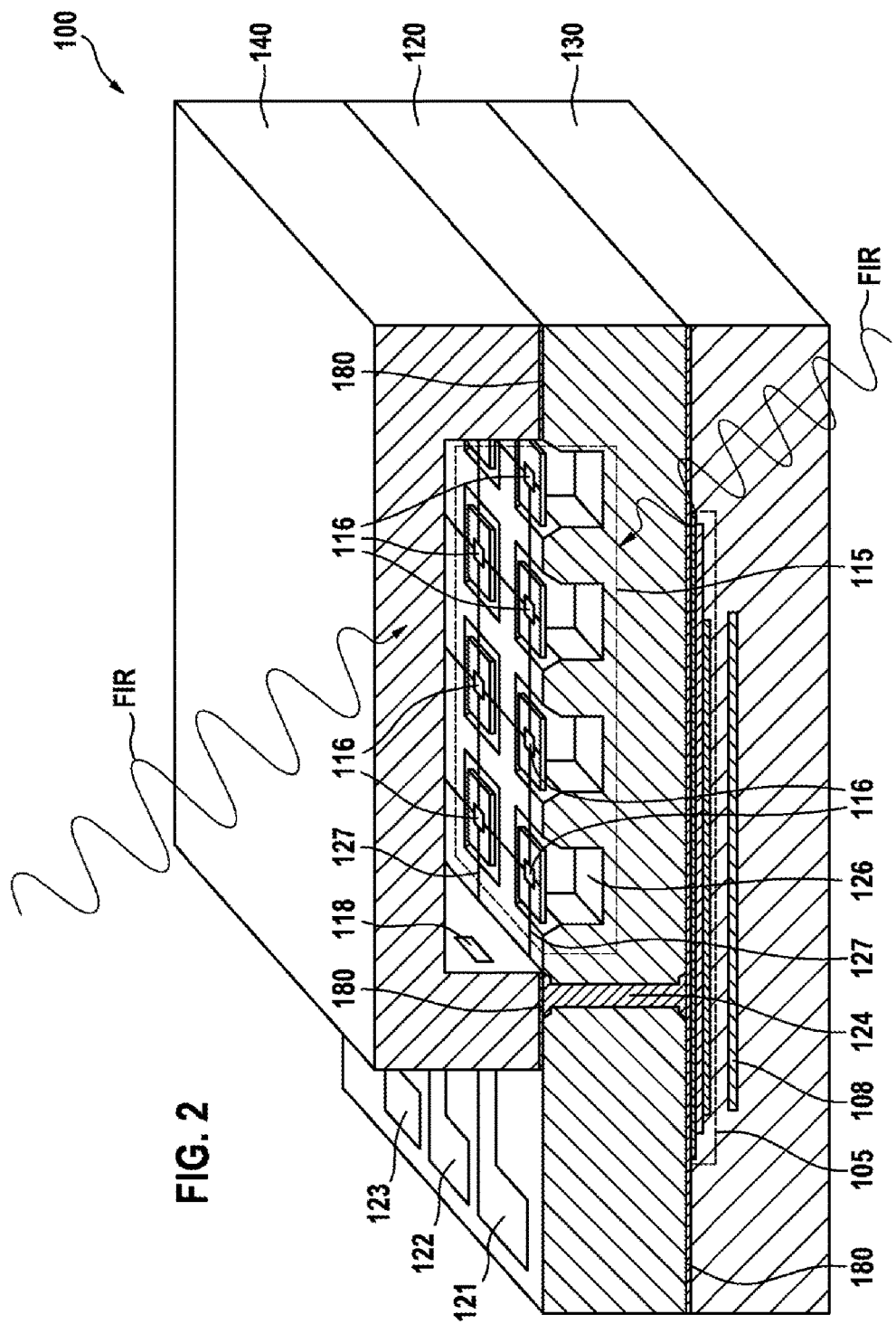
FIG. 2 shows a schematic representation of an arrangement of three wafers for detecting electromagnetic radiation, in particular far infrared radiation, according to another embodiment of the disclosure.

FIG. 2 shows a schematic representation of an arrangement of three wafers for detecting electromagnetic radiation according to another embodiment of the disclosure.

In contrast to the embodiment shown in FIG. 1, in the embodiment shown in FIG. 2 the arrangement 100 furthermore comprises a third wafer 140, which is configured as a cap wafer for the sensor array.

In the embodiment shown in FIG. 2, furthermore, the integrated circuit 105 comprises a heat shield 108 and the microsystem 115 comprises a getter device 118. The heat shield 108 is for example configured as a layer which reflects the electromagnetic radiation, or far infrared radiation.

The getter device 118 is configured for example as a getter, i.e. as a chemically reactive material which is used to maintain a reduced pressure for as long as possible. On the surface of the getter device 118, gas molecules form a direct chemical bond with the atoms of the getter material, or the gas molecules are held by sorption. In this way, gas molecules are trapped and the internal pressure of the cavity is reduced.

The other references represented in FIG. 2 have already been described in the figure description associated with FIG. 1, and will therefore not be explained again.

Figure 3:
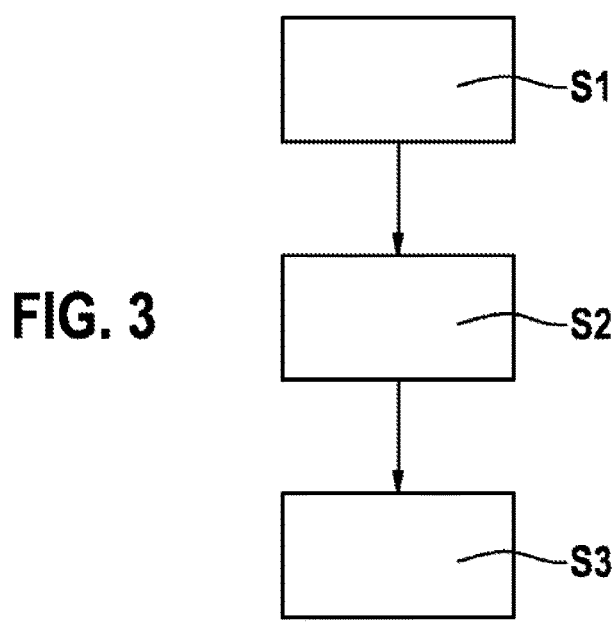
FIG. 3 shows a schematic representation of a flowchart of a method for producing an arrangement of at least two wafers for detecting electromagnetic radiation, in particular far infrared radiation, according to yet another embodiment of the disclosure.
Figure 4:
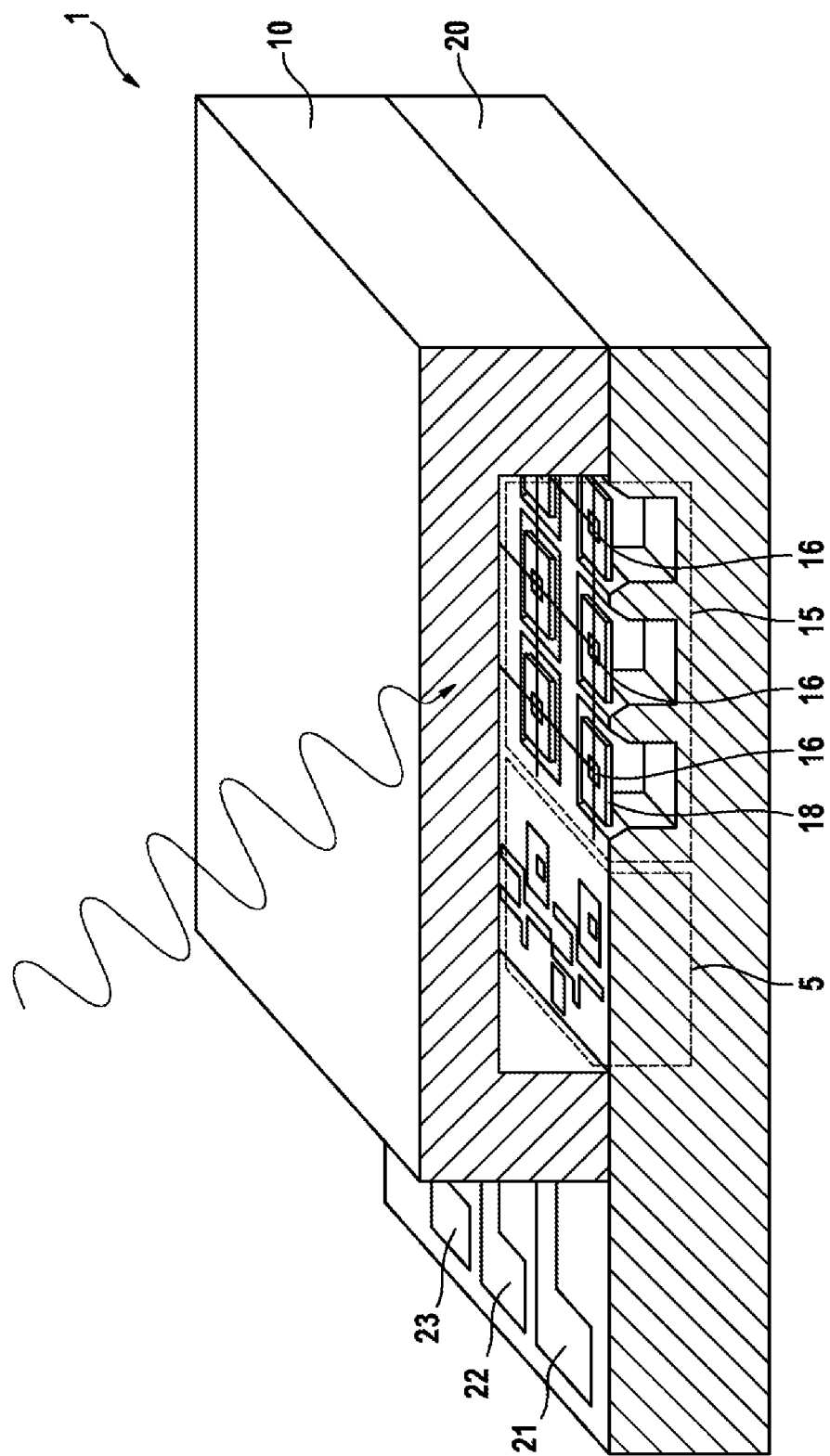
FIG. 4 shows an exemplary representation of an arrangement of two wafers.

FIG. 3 shows a schematic representation of a flowchart of a method for producing an arrangement of at least two wafers for detecting electromagnetic radiation, in particular far infrared radiation, according to yet another embodiment of the disclosure.

As a first method step, provision S1 of a first wafer 120 having a microsystem 115 and of a second wafer 110; 130 having an integrated circuit 105 is carried out.

As a second method step, application S2 of bonding material 180 onto the first wafer 120 and onto the second wafer 110; 130 is carried out.

As a third method step, bonding S3 of the first wafer 120 provided with bonding material 180 and of the second wafer 110; 130 provided with bonding material 180 is carried out in order to produce the arrangement.

Although the present disclosure has been described above with the aid of preferred exemplary embodiments, it is not restricted thereto but may be modified in a variety of ways. In particular, the disclosure may be altered or modified in a large number of ways without departing from the core of the disclosure.

The invention claimed is:

1. An arrangement of at least two wafers for detecting electromagnetic radiation, comprising:
    a first wafer including a microsystem formed as a sensor array including a plurality of sensor elements positioned at a first side of the first wafer, each of the plurality of sensor elements associated with a respective one of a plurality of cavities in the first side of the first wafer, the microsystem configured to register electromagnetic radiation and provide a corresponding sensor signal;
    a second wafer bonded to a second side of the first wafer with at least one wafer bonding material and including an integrated circuit formed as an evaluation circuit that is coupled to the sensor array, the integrated circuit configured to detect the electromagnetic radiation with the aid of the sensor signal provided; and
    a third wafer including a cavity, the cavity positioned directly above the sensor array and open to the sensor array.

2. The arrangement as claimed in claim 1, wherein the evaluation circuit is configured as a circuit array.

3. The arrangement as claimed in claim 1, wherein each of the plurality of sensor elements comprises at least one diode element.

4. The arrangement as claimed in claim 3, wherein:
    the evaluation circuit includes at least one evaluation unit; and
    each of the at least one diode elements is coupled to the at least one evaluation unit.

5. The arrangement as claimed in claim 3, wherein the at least one diode elements are connected in series.

6. The arrangement as claimed in claim 1, wherein the integrated circuit is configured as an application-specific integrated circuit.

7. The arrangement as claimed in claim 1, wherein the sensor array is configured as a microbolometer array for registering the electromagnetic radiation.

8. The arrangement as claimed in claim 1, wherein the integrated circuit has a heat shield.

9. The arrangement as claimed in claim 1, wherein the microsystem has a getter device.

10. The arrangement as claimed in claim 1, wherein the first wafer has a through-contact.

11. The arrangement as claimed in claim 1, wherein the second wafer has a through-contact.

12. The arrangement as claimed in claim 1, wherein the electromagnetic radiation is far infrared radiation.

13. The device of claim 1, wherein:
    the sensor array defines a plane; and
    the second wafer is configured such that a line orthogonal to the plane extends through the sensor array and the integrated circuit.

14. A method for producing an arrangement of at least two wafers for detecting electromagnetic radiation, comprising:
    providing a first wafer having a microsystem formed as a sensor array, the sensor array including a plurality of sensor elements positioned at a first side of the first wafer, each of the plurality of sensor elements associated with a respective one of a plurality of cavities in the first side of the first wafer, the microsystem configured to register electromagnetic radiation and provide a corresponding sensor signal and a second wafer having an integrated circuit formed as an evaluation circuit that is coupled to the sensor array, the integrated circuit configured to detect the electromagnetic radiation with the aid of the sensor signal provided;
    applying bonding material onto the first wafer and onto the second wafer;
    bonding the first wafer provided with bonding material and the second wafer provided with bonding material in order to produce the arrangement;
    positioning a third wafer including a cavity directly above the sensor array such that the cavity opens to the sensor array; and
    bonding the third wafer to the first side of the first wafer.

15. The method as claimed in claim 14, wherein the electromagnetic radiation is far infrared radiation.

16. The method of claim 14, wherein:
    the sensor array defines a plane; and
    bonding the first wafer includes bonding the first wafer and the second wafer such that a line orthogonal to the plane extends through the sensor array and the integrated circuit in order to produce the arrangement.

* * * * *